(12) United States Patent
Thompson et al.

(10) Patent No.: US 9,741,895 B2
(45) Date of Patent: Aug. 22, 2017

(54) REMOVAL OF 3D SEMICONDUCTOR STRUCTURES BY DRY ETCHING

(71) Applicant: GLO AB, Lund (SE)

(72) Inventors: Daniel Bryce Thompson, Walnut Creek, CA (US); Cynthia Lemay, Santa Clara, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/159,235

(22) Filed: May 19, 2016

(65) Prior Publication Data

US 2016/0260864 A1 Sep. 8, 2016

Related U.S. Application Data

(63) Continuation of application No. 14/306,731, filed on Jun. 17, 2014, now Pat. No. 9,368,672.

(Continued)

(51) Int. Cl.
*H01L 33/00* (2010.01)
*H01L 33/62* (2010.01)
(Continued)

(52) U.S. Cl.
CPC ........ *H01L 33/0025* (2013.01); *H01L 33/005* (2013.01); *H01L 33/08* (2013.01); *H01L 33/16* (2013.01); *H01L 33/30* (2013.01); *H01L 33/62* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| 7,875,195 B2 | 1/2011 | Rabin et al. |
| 2008/0210662 A1 | 9/2008 | Rabin et al. |

(Continued)

FOREIGN PATENT DOCUMENTS

| JP | 4058937 B2 | 3/2008 |
| KR | 10-2012-0051970 A | 5/2012 |
| KR | 10-2013-0009399 A | 1/2013 |

OTHER PUBLICATIONS

International Search Report and Written Opinion, International Application No. PCT/US2014/042673, issued Oct. 10, 2014.

(Continued)

*Primary Examiner* — Alexander Ghyka
(74) *Attorney, Agent, or Firm* — The Marbury Law Group PLLC

(57) ABSTRACT

Various embodiments include methods of fabricating a semiconductor device that include providing a plurality of nanostructures extending away from a support, forming a flowable material layer between the nanostructures, forming a patterned mask over a first portion of the flowable material and the first portion of the plurality of nanostructures, such that a second portion of the flowable material and a second portion of the plurality of nanostructures are not located under the patterned mask and etching the second portion of the flowable material and the second portion of the plurality of nanostructures to remove the second portion of the flowable material and the second portion of the plurality of nanostructures to leave the first portion of the flowable material and the first portion of the plurality of nanostructures unetched.

12 Claims, 12 Drawing Sheets

Related U.S. Application Data

(60) Provisional application No. 61/836,316, filed on Jun. 18, 2013.

(51) Int. Cl.
*H01L 33/30* (2010.01)
*H01L 33/08* (2010.01)
*H01L 33/16* (2010.01)

(56) References Cited

U.S. PATENT DOCUMENTS

| | | |
|---|---|---|
| 2008/0277676 A1 | 11/2008 | Hong et al. |
| 2008/0277746 A1 | 11/2008 | Hsu et al. |
| 2011/0163292 A1 | 7/2011 | Wang et al. |
| 2011/0279900 A1 | 11/2011 | Wang et al. |
| 2011/0309382 A1 | 12/2011 | Löwgren et al. |
| 2012/0009390 A1 | 1/2012 | Yang et al. |
| 2013/0128362 A1 | 5/2013 | Song et al. |
| 2013/0143342 A1 | 6/2013 | Zhu et al. |
| 2014/0370631 A1 | 12/2014 | Thompson et al. |

OTHER PUBLICATIONS

International Search Report and Written Opinion, International Application No. PCT/US2014/042656, issued Oct. 16, 2014.
International Search Report and Written Opinion, International Application No. PCT/US2014/042649, issued Oct. 16, 2014.

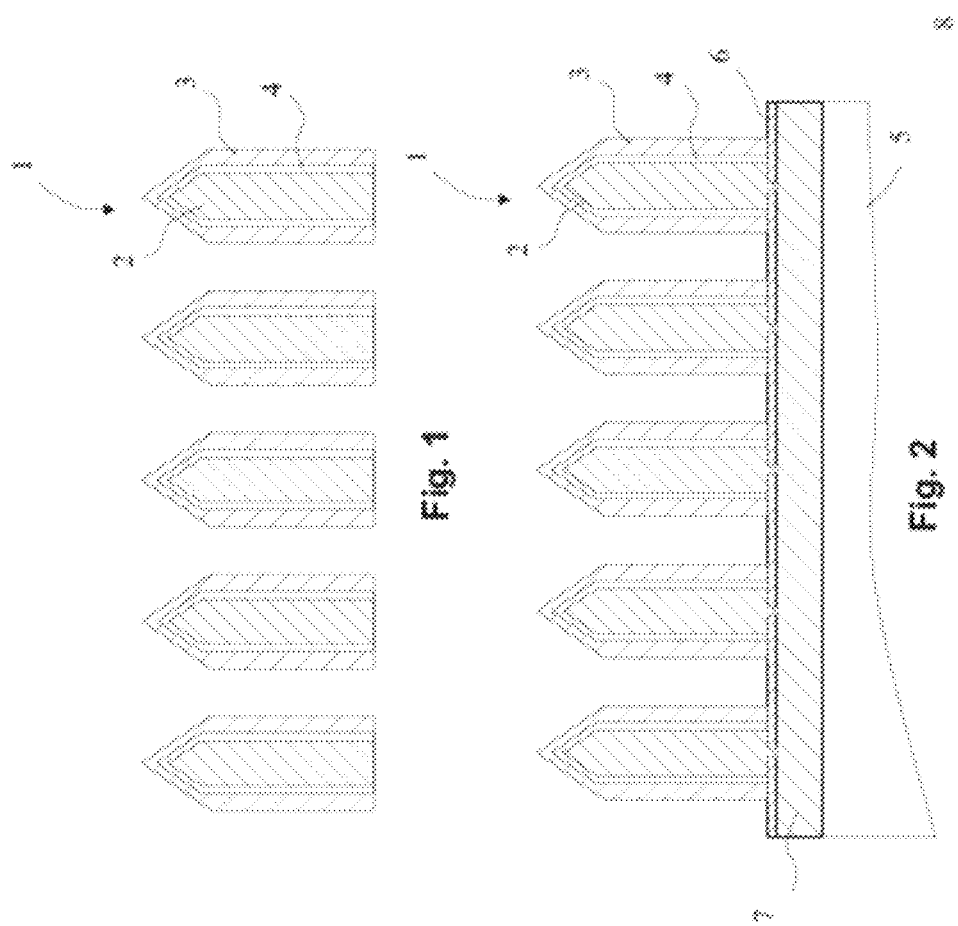

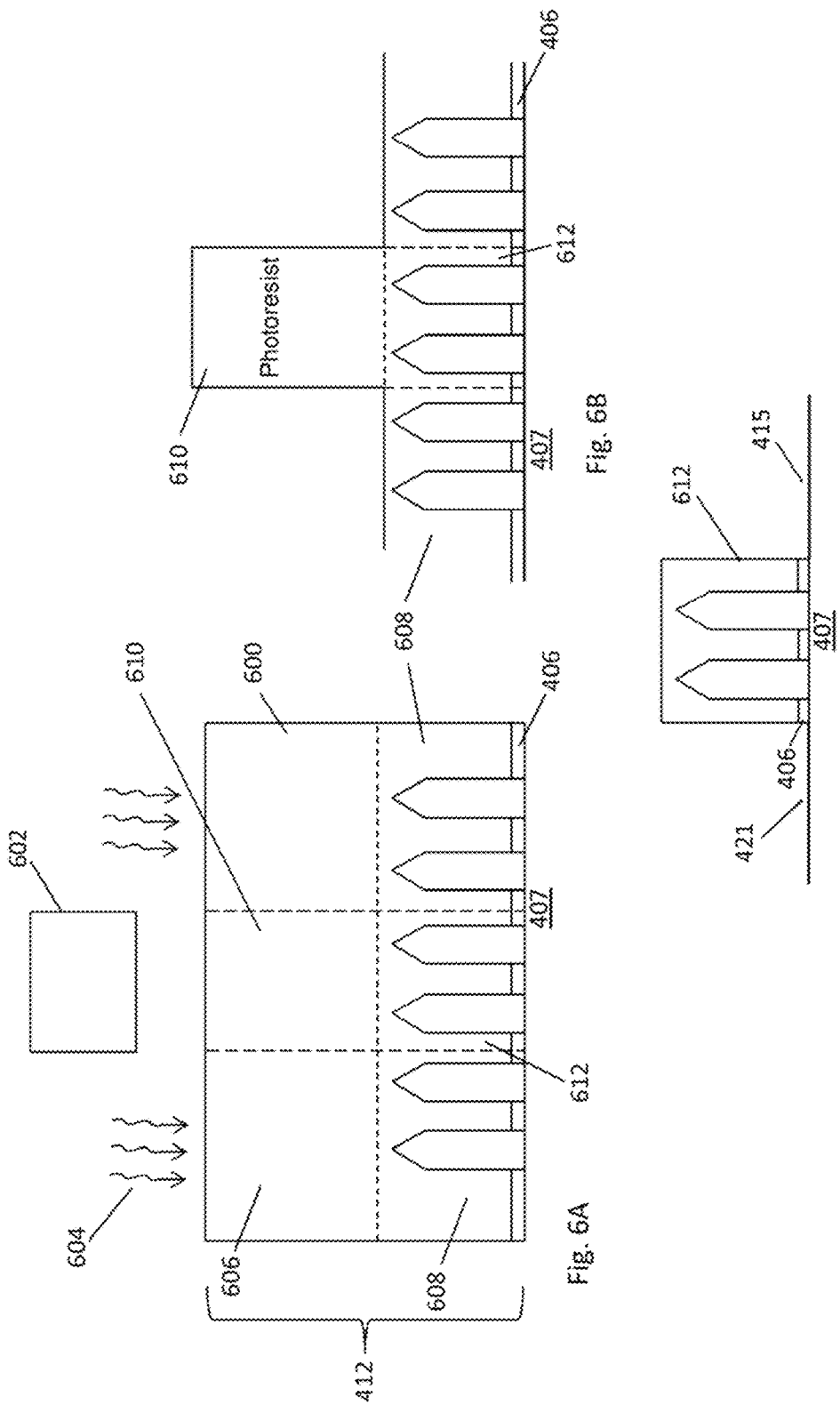

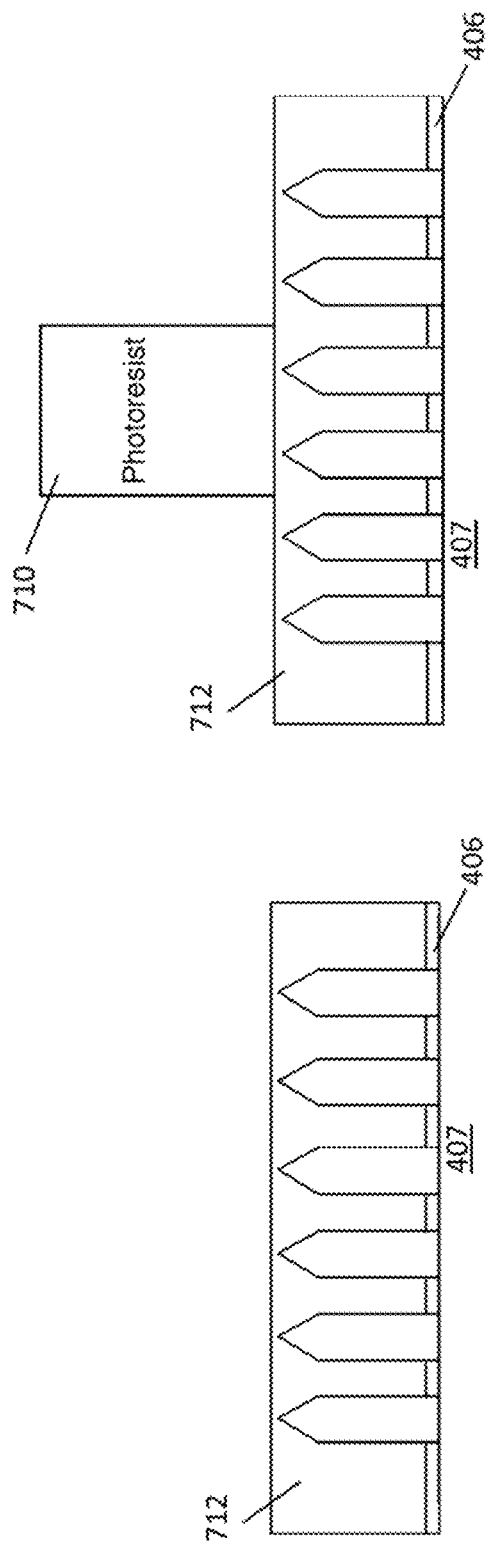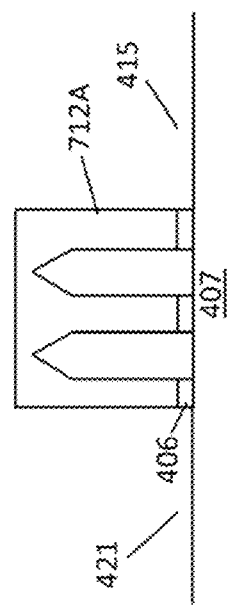

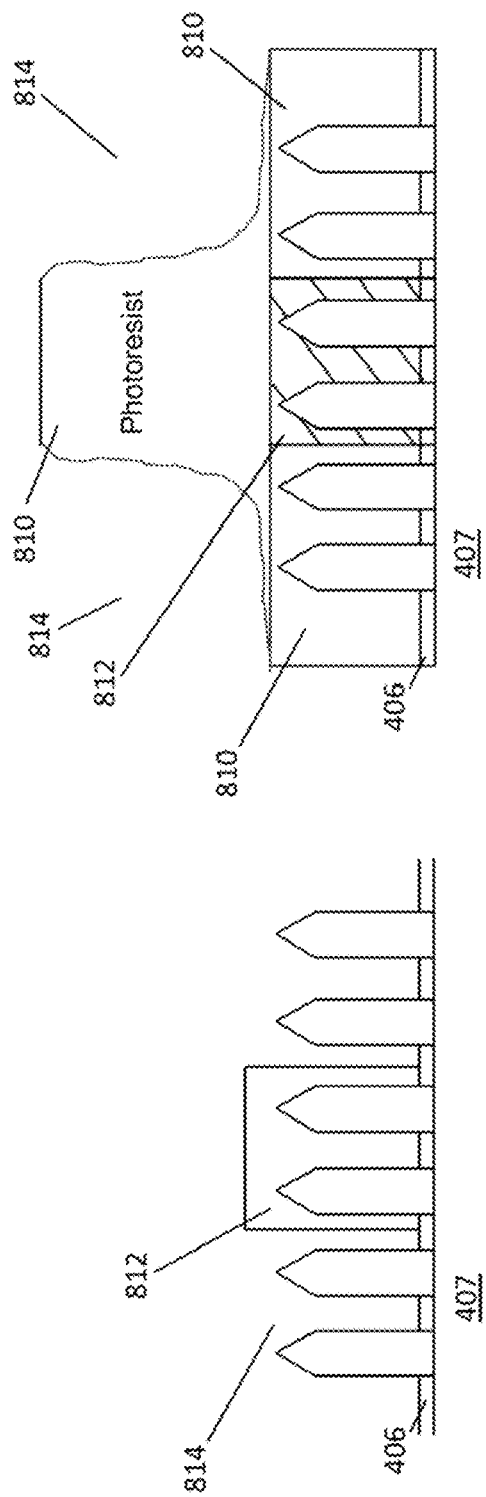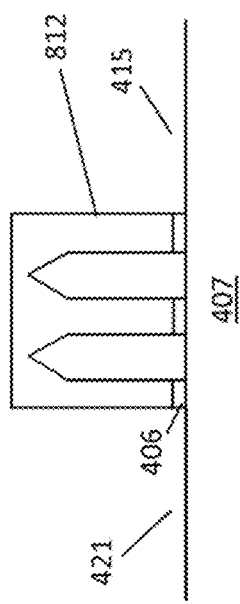

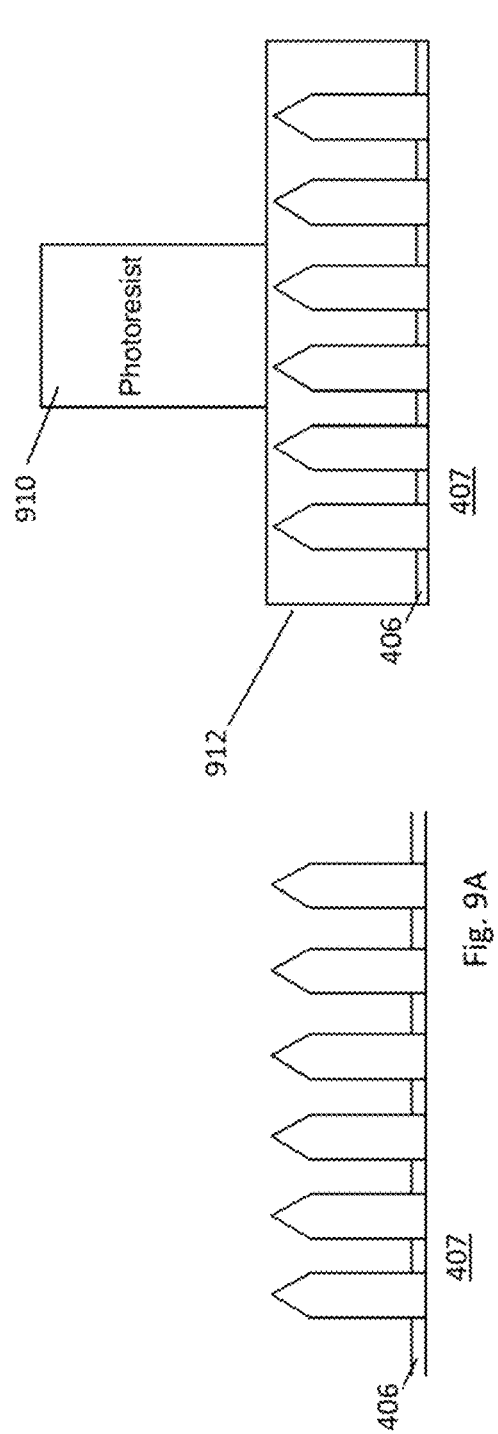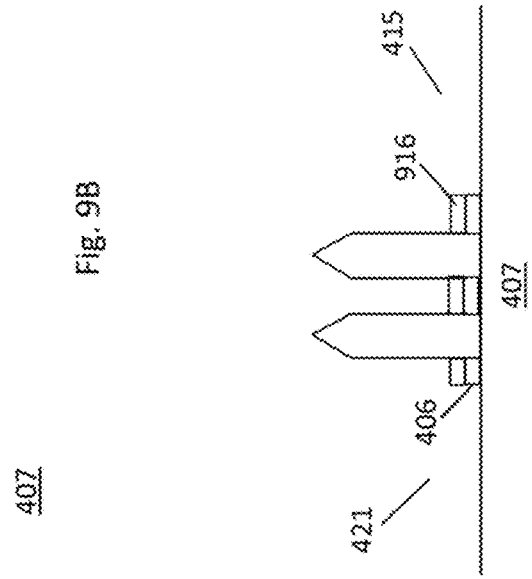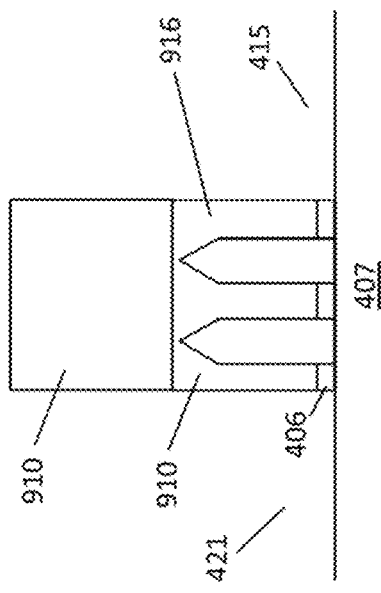

REMOVAL OF 3D SEMICONDUCTOR STRUCTURES BY DRY ETCHING

BACKGROUND

Nanowire light emitting diodes (LED) are of increasing interest as an alternative to planar LEDs. In comparison with LEDs produced with conventional planar technology, nanowire LEDs offer unique properties due to the three-dimensional nature of the nanowires, improved flexibility in materials combinations due to less lattice matching restrictions and opportunities for processing on larger substrates.

SUMMARY

Embodiments are drawn to an etching method including providing a plurality of nanostructures extending away from a support, forming a flowable material layer between the nanostructures, forming a patterned mask over a first portion of the flowable material and the first portion of the plurality of nanostructures, such that a second portion of the flowable material and a second portion of the plurality of nanostructures are not located under the patterned mask and etching the second portion of the flowable material and the second portion of the plurality of nanostructures to remove the second portion of the flowable material and the second portion of the plurality of nanostructures to leave the first portion of the flowable material and the first portion of the plurality of nanostructures unetched.

Embodiments are also drawn to an etching method including providing a plurality of nanostructures extending away from a support, forming a flowable material layer between the nanostructures, patterning the flowable material such that a first portion of the flowable material located over a first portion of the plurality of nanostructures is thicker than a second portion of the flowable material located over a second portion of the plurality of nanostructures, and etching the flowable material to reduce a thickness of the first portion of the flowable material and leave the first portion of the plurality of nanostructures unetched, and to remove the second portion of the flowable material and the second portion of the plurality of nanostructures.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

FIG. 1 schematically illustrates a side cross sectional view of a basis of a nanowire LED device in accordance with embodiments of the invention.

FIG. 2 schematically illustrates a side cross sectional view of a basis of a nanowire LED device on a buffer layer in accordance with embodiments of the invention.

FIGS. 6A-6C schematically illustrate side cross sectional views of a process for removal of nanowires illustrated in FIGS. 4B and 4C according to an embodiment.

FIGS. 7A-7C schematically illustrate side cross sectional views of an alternative process for removal of nanowires illustrated in FIGS. 4B and 4C according to another embodiment.

FIGS. 8A-8C schematically illustrate side cross sectional views of an alternative process for removal of nanowires illustrated in FIGS. 4B and 4C according to another embodiment.

FIGS. 9A-9D schematically illustrate side cross sectional views of an alternative process for removal of nanowires illustrated in FIGS. 4B and 4C according to another embodiment.

DETAILED DESCRIPTION

Figure 3B:
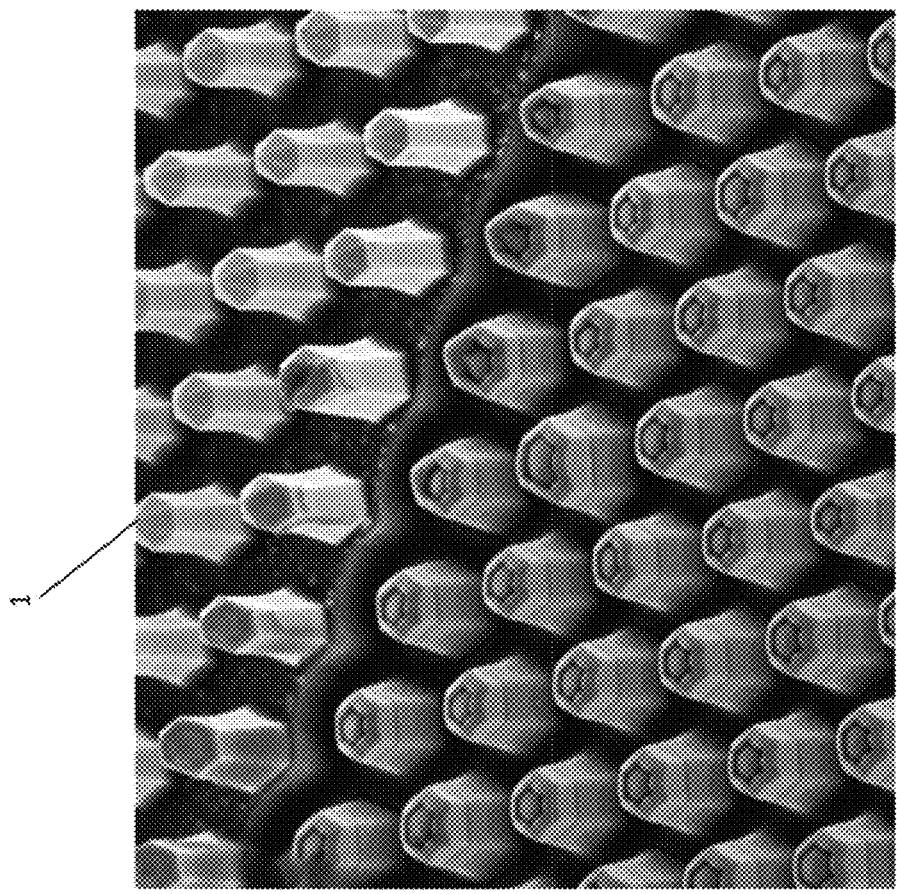
FIGS. 3A-3B are scanning electric microscopy (SEM) micrographs illustrating A) a failed wire bond on GaN nanowires and B) the etching of a substrate lacking flowable material in the spaces between nanowires on the substrate.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The embodiments of the invention are directed generally to methods of fabricating nanowire semiconductor devices, such as nanowire LED devices, that include forming an insulating layer on a nanowire array, and removing a portion of the insulating layer to define a planar surface that may be used as an active region of a nanowire device. Further embodiments are directed to nanowire devices fabricated in accordance with the embodiment methods. The various embodiments may provide a nanowire device with planarized bond pad areas with fewer process steps and a larger active region than can be accomplished using a conventional dry etch active region definition.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure.

All references to upper, top, lower, downwards etc. are made as considering the substrate being at the bottom and the nanowires extending upwards from the substrate. Vertical refers to a direction perpendicular to the plane formed by the substrate and horizontal to a direction parallel to the plane formed by the substrate. This nomenclature is introduced for the ease of understanding only, and should not be considered as limiting to specific assembly orientation etc.

Any suitable nanowire LED structure as known in the art may be used in the methods of the invention. Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

FIG. 1 schematically illustrates the basis for a nanowire LED structure that is modified in accordance with embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowire LEDs 1 having an n-type nanowire core 2 and a p-type shell 3 at least partly enclosing the nanowire core 2 and an intermediate active region 4, which may comprise a single intrinsic or lightly doped (e.g., doping level below $10^{16}$ $cm^{-3}$) semiconductor layer or one or more quantum wells, such as 3-10 quantum wells comprising a plurality of semiconductor layers of different band gaps. However, for the purpose of embodiments of the invention nanowire LEDs are not limited to this. For example the nanowire core 2, the active region 4 and the p-type shell 3 may be made up from a multitude of layers or segments. In alternative embodiments, only the core 2 may comprise a nanostructure or nanowire by having a width or diameter below 2 micron, while the shell 3 may have a width or diameter above one micron.

The III-V semiconductors are of particular interest due to their properties facilitating high speed and low power electronics and optoelectric devices such as lasers and light emitting diodes (LEDs). The nanowires can comprise any semiconductor material, and suitable materials for the nanowire include but are not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$ $cm^{-3}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductor (e.g., InP, GaAs). In order to function as a LED, the n-side and p-side of each nanowire LED 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified by the "pyramid" facets and the vertical sidewall facets. The LEDs can be fabricated so that the emission layer formed on templates with dominant pyramid facets or sidewall facets. The same is true for the contact layer, independent of the shape of the emission layer.

FIG. 2 illustrates an exemplary structure that provides a support for the nanowires. By growing the nanowires 1 on a growth substrate 5, optionally using a growth mask, or dielectric masking layer, 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the root area of the core 2 inside each opening in the dielectric masking layer 6. The substrate 5 may comprise different materials, such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowire cores 2 are grown directly on the growth substrate 5.

Preferably, the substrate 5 is also adapted to function as a current transport layer connecting to the n-side of each nanowire LED 1. This can be accomplished by having a substrate 5 that comprises a semiconductor buffer layer 7 arranged on the surface of the substrate 5 facing the nanowire LEDs 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire LEDs 1 may comprise several different materials (e.g., GaN core, GaN/InGaN multiple quantum well active region and AlGaN shell having a different Al to Ga ratio than the active region). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The use of sequential (e.g., shell) layers gives that the final individual device (e.g., a pn or pin device) may have a shape anywhere between a pyramid or tapered shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) µm, such as 100 nm to below 2 micron, and heights ranging from a few 100 nm to several (e.g., 10) µm.

The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

Nanowire LEDs, such as GaN-based nanowire LEDs, show promise in increasing the efficiency and wavelength stability compared to planar LEDs. However, the three-dimensional nature of nanowires can pose challenges in fabrication, notably the wire bonding step where the LED device (i.e., chip) is connected to an external current/voltage source. The wire bonding step involves application of mechanical pressure and vibration from the wire to the device. This pressure and vibration of the wire bonding process can break nanowires due to the leverage from the pressure point at the top of the wire to the weak small nucleation base of the nanowire. Therefore, in areas where a wire will be bonded to the device, it is desirable to planarize the area to avoid developing a lever arm that can break the nanowires.

The fabrication process of a nanowire LED typically also involves defining the active region of a device. This is usually accomplished by a dry etch of a nearly-completed device, which results in a break in the continuity of either the n- or p-side conductive layers, resulting in isolated devices. Alternatively, the nanowires may be etched prior to conductive film deposition (e.g., the top electrode or contact deposition) to define the active region. However, if nanowires are etched prior to conductive film deposition, there will typically be some nanowires that are partially etched, requiring the deposition of a passivating film prior to depositing the conductive film to avoid shorting the exposed p-n junction. This passivation film must be separately masked and etched, which then consumes some of the active region to allow for the transition region to be sufficiently isolated from conductive film deposition.

Various embodiments include methods for fabricating nanowire semiconductor devices, such as nanowire LED devices, that include forming an insulating layer, such as a low temperature oxide (LTO) layer, on a nanowire array to planarize the array, and removing a portion of the insulating layer, such as by wet etching through a patterned mask, to define an active region of a nanowire device. Further embodiments are directed to nanowire devices fabricated in accordance with the embodiment methods. The various embodiments may provide a nanowire device with planarized bond pad areas with fewer process steps and a larger active region than can be accomplished using a conventional dry etch active region definition.

Figure 3A:
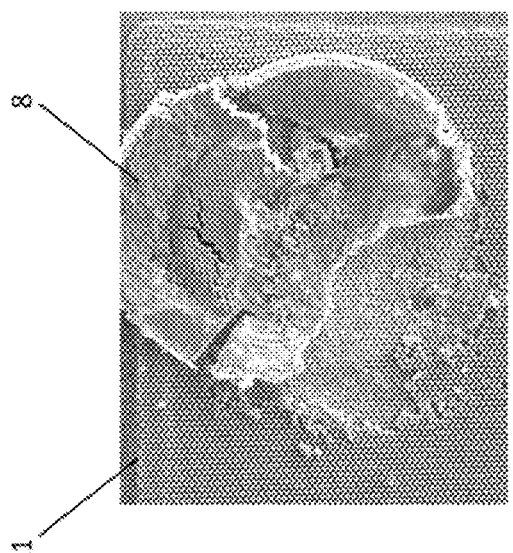

FIG. 3A is a scanning electric microscopy (SEM) micrograph of a top view looking down illustrating a failed wire bond on GaN nanowires 1. As can be seen in the micrograph of FIG. 3A, many of the nanowires 1 are broken. Further, the micrograph evidences failure of adhesion of the ball bond (not shown) to the metal pad on 8 the GaN nanowires. That is, much of the metal pad 8 is attached to the nanowires 1 but the ball bond has separated from the metal pad 8.

FIG. 3B is a SEM micrograph viewed at a tilt angle illustrating etching of the substrate while etching the nanowires during fabrication of an LED device. The SEM micrograph of FIG. 3B was taken at a higher magnification than that of FIG. 3A. As can be seen in FIG. 3B, etching of the nanowires during device fabrication without providing a material filling the spaces in between the nanowires causes the substrate to be etched. It is believed that this etching of the substrate resulting in a non-planar etched surface is a contributing factor in the failure of ball bond adhesion.

Figure 4A:
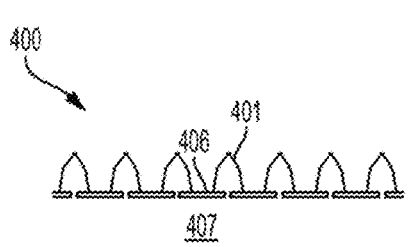
FIGS. 4A-4J schematically illustrate side cross sectional views of a process for fabricating a nanowire LED array having an insulating layer for planarizing and defining an active region according to an embodiment.

An embodiment of a method for fabricating a nanowire device is schematically illustrated in FIGS. 4A-4J and 5A-5E. FIG. 4A schematically illustrates a nanowire LED device 400 that includes a plurality of nanowires 401, a buffer layer 407 and a dielectric masking layer 406 (e.g., SiN layer, such as a stoichiometric or non-stoichiometric silicon nitride layer), as described above in connection with FIGS. 1 and 2. The nanowires 401 may each comprise a nanowire core of a first conductivity type (e.g., n-type), a shell of a second conductivity type (e.g., p-type), and an intermediate light-generating active region, as described above in connection with FIGS. 1 and 2. The nanowire cores may be in electrical contact with the buffer layer 407, and the nanowire shells may be insulated from the buffer layer by the dielectric masking layer 406, as described above.

Figure 4B:
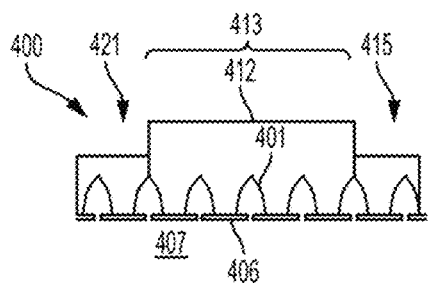
Figure 4C:
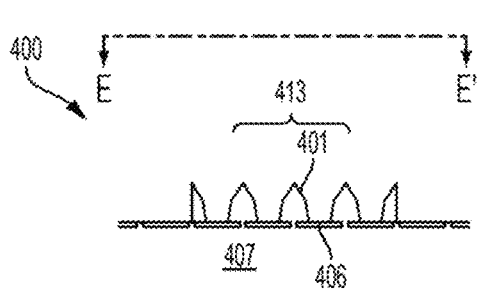
Figure 4D:
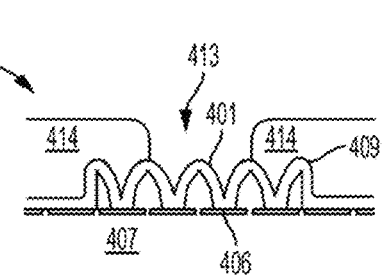
Figure 5E:
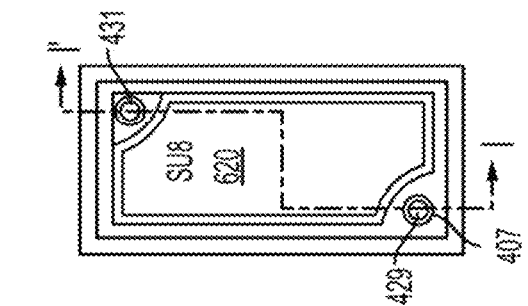
FIGS. 5A-5E are top views of a nanowire LED device schematically illustrating the fabrication process of FIGS. 4A-4J.
Figure 5D:
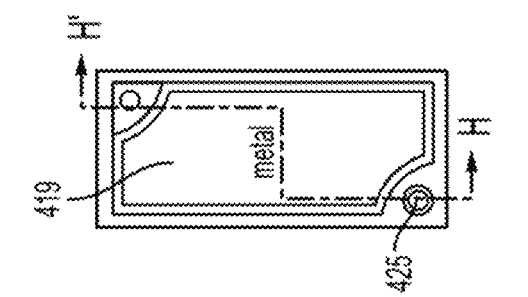
Figure 5C:
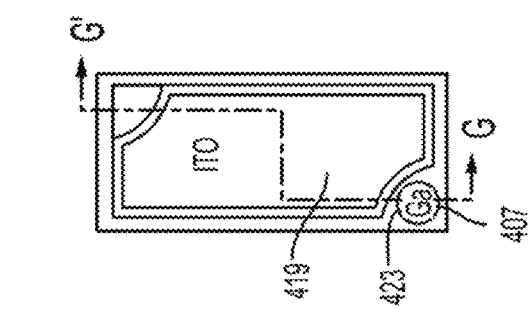
Figure 5B:
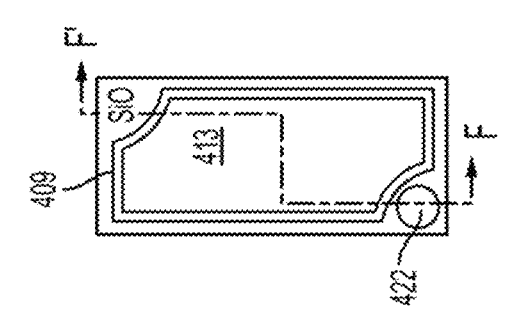
Figure 5A:
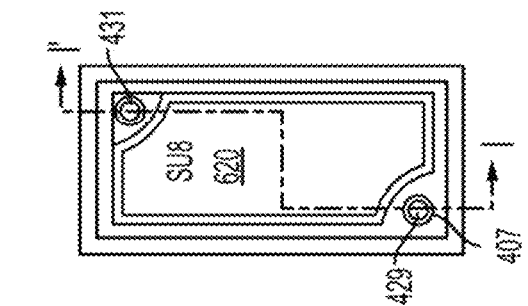

In FIG. 4B, a first mask layer 412, which may be a photoresist layer, is formed over the nanowires 401. The first mask layer 412 may be patterned using standard lithographic techniques to cover the nanowires 401 in an active region 413 of the device 400, and to define exposed regions 421, 415. The device 400 may be etched to transfer the pattern of the first mask layer 412 to the device 400. The etch may be a dry etch (e.g., an inductively coupled plasma (ICP) etch), which may utilize a chlorine gas plasma. The exposed nanowires 401 are removed to "flatten" the device in regions 415 and 421 and to expose the masking layer 406 in these regions 415, 421, as shown in FIG. 4C. If desired, the masking layer 406 in regions 415, 421 may also be removed to expose the support (e.g. buffer layer 407). These "flattened" regions may later be used to form electrical contacts, as described below. Following the etch, the first mask layer 412 may be removed to provide the device 400 as shown in FIG. 4C. FIG. 5A is a top view of the device 400 after etching and removal of the patterned first mask layer 412. Line E-E' in FIG. 5A corresponds to line E-E' in FIG. 4C, though the device 400 is not necessarily shown to scale.

FIGS. 6A-6C illustrate details of a first embodiment for the masking and etching steps illustrated in FIGS. 4B and 4C. In this embodiment, rather than remove the entire first mask layer 412 from around the nanowires 401 as illustrated in FIG. 4C, the method of FIGS. 6A-6C results in a portion 614 of the first mask layer 412 remaining in the spaces between the nanowires 401. In a first step as illustrated in FIG. 6A, a relatively thick first mask layer 412 of a flowable material, such as a photoresist material, is deposited over the nanowires 401. The photoresist is patterned by exposing the photoresist through a photolithography mask 602 with radiation 604, such as optical or ultraviolet (UV) radiation. Electron beam photolithography may be used instead. As illustrated in FIG. 6A, an upper portion 606 of the photoresist is exposed by the radiation 604, while a lower portion 608 and upper portion 610 under mask 602 of the photoresist remain unexposed. The unexposed central portion 612 of the lower portion 608 of the photoresist is located under the unexposed upper portion 610.

As illustrated in FIG. 6B, the exposed portions 606 of the photoresist may then be removed, such as by dissolving in a solvent. The lower, unexposed portions 608 and upper unexposed portion 610 of the first mask layer 412 shielded by the photolithography mask 602 remain after removal of portions 606. This photoresist structure 608, 610 may then be etched, such as by an anisotropic dry etching process which etches the resist and the nanowires at about the same rate. As illustrated in FIG. 6C, the upper portion 610 and the lower portions 608 of the photoresist as well as the nanowires 401 embedded in the lower portions 608 of the photoresist are removed by the etching to define exposed regions 415 and 421. This step results in etching of the exposed nanowires 401 such that these nanowires 401 are removed in a layer parallel to the substrate (e.g., wafer). When the exposed nanowires 401 are completely removed, the underlying substrate in exposed regions 415 and 421 is substantially planar. The remaining nanowires 401 are embedded in a layer 612 photoresist material.

Thus, as shown in FIGS. 6A-6B, the flowable material (e.g., the photoresist 412 layer) is patterned such that a first (e.g., central) portion 610, 612 of the flowable material located over a first portion of the plurality of nanostructures is thicker than a second (e.g., peripheral) portion 608 of the flowable material located over a second portion of the plurality of nanostructures. The flowable material is then etched as shown in FIG. 6C to reduce a thickness of the first portion 610,612 of the flowable material (e.g., to remove the upper central portion 610 over the remaining lower central portion 612) and leave the first portion of the plurality of nanostructures unetched, and to remove the second portion 608 of the flowable material and the second portion of the plurality of nanostructures.

FIGS. 7A-7C illustrate details of a second embodiment for the masking and etching steps illustrated in FIGS. 4B and 4C. In this embodiment, a first flowable material 712 is deposited between the nanowires 401 as illustrated in FIG. 7A. As illustrated in FIG. 7B, a photoresist layer is deposited on top of the first flowable material 712 and patterned to leave a pattern 710. The first flowable material 712 and the nanowires 401 embedded in the first flowable material 712 are etched using the photoresist pattern 710 as a mask. When etching is complete, the remaining photoresist 710 can be striped to form the structure illustrated in FIG. 7C in which the remaining nanowires 401 are embedded in a remaining portion 712A of the layer of flowable material 712, which was covered by photoresist pattern 710, surrounded by exposed regions 415 and 421.

FIGS. 8A-8C illustrate details of a third embodiment for the masking and etching steps illustrated in FIGS. 4B and 4C. In a first step illustrated in FIG. 8A, a first photoresist layer 812 is deposited over the nanowires 401 and patterned. A second photoresist layer 810 is deposited over the first photoresist layer 812. Portions 814 of device in which the first photoresist layer 812 was removed are covered with the second photoresist layer 810 while the nanowires 401 outside of portions 814 are covered by both the first photoresist layer 812 and the second photoresist layer 810. The resulting structure is illustrated in FIG. 8B. This structure may now be dry etched. The portion of the second photoresist layer 810 above the patterned first photoresist layer 812 is removed as the nanowires 401 and the surrounding second photoresist layer 810 are removed similar to the method illustrated in FIGS. 6B, 6C. The final structure is illustrated in FIG. 8C (which is similar to FIG. 6C).

Thus, in the embodiment illustrated in FIGS. 6A-6C, a single photoresist layer is partially exposed as a function of thickness. In the embodiment illustrated in FIGS. 8A-8C, two photoresist layers are used. In the embodiment illustrated in FIGS. &A-7C, separate photoresist and other flowable layer(s) are used.

FIGS. 9A-9C illustrate details of a fourth embodiment for the masking and etching steps illustrated in FIGS. 4B and 4C. In this embodiment a first layer of flowable material 912, such as a photoresist or a spin on glass is deposited over and between the nanowires 401. A second layer of a photoresist is deposited over the first layer of flowable material 912 and patterned to form the structure 910 illustrated in FIG. 9B. This structure is then dry etched to remove the nanowires 401 with an etchant that does not remove the portion of the photoresist layer 910 as illustrated in FIG. 9C. After removing the nanowires 401 and the unprotected first layer of flowable material 912, the remaining photoresist 910 may be removed to leave nanowires 401 fully embedded in first layer of flowable material 912 that was protected by the photoresist 910. Optionally, a portion of the first layer of flowable material 912 (e.g. a spin on glass) between the nanowires 401 may be recessed to leave a reduced thickness layer 916 of flowable material 912 between the nanowires 401, such that nanowires 401 tips are exposed above layer 916. Optionally, the step of removing a portion of the first layer of flowable material 912 may be performed with any of the preceding embodiments.

Returning to FIG. 4D, a dielectric layer 409 is formed over the device, including over the nanowires 401 in active region 413 and over the "flattened" regions 415, 421 in which the nanowires have been removed. The dielectric layer 409 may be a $SiO_2$ layer and may be formed by low temperature oxide (LTO) deposition. LTO deposition may be accomplished by chemical vapor deposition (CVD) at low temperature (e.g., less than 750° C., such as 300-400° C., including 400-500° C., or about 450° C.), and at sub-atmospheric pressure, such as 10 Torr or less (e.g., $10^{-6}$ Torr to 1 Torr, such as 100-500 mTorr, including about 450 mTorr), with flows of $SiH_4$ and $O_2$. The $O_2$ flow may be in excess of the $SiH_4$ flow in standard cubic cm per minute (sccm). Typical flow rates may be, for example, 85 sccm $SiH_4$ and 120 sccm $O_2$.

The dielectric layer 409 may be deposited with an average thickness of 0.01-10 μm (e.g., 0.1 to 1 μm, such as about 0.4 μm) over the device 400. A second mask layer 414, which may be a photoresist layer, is formed over the dielectric layer 409. The second mask layer 414 may be patterned using standard lithographic techniques to define an opening in the second mask layer 414 corresponding with the active region 413 of the device 300. The device 300 may then be etched to transfer the pattern of the second mask layer 414 to the dielectric layer 409. In embodiments, the dielectric layer 409, which may be $SiO_2$, may be etched using a wet etch of diluted hydrofluoric acid (HF) to remove the dielectric layer 409 from the active region 413 of the device. A typical concentration for a wet etch solution may be, for example, 1 part HF to 3 parts $H_2O$. A HF etch may remove select portions of dielectric layer 409 while leaving the nanowires 401 in the active region 413 undisturbed. The $SiO_2$ may also be etched using a gas such as chlorine.

Figure 4E:
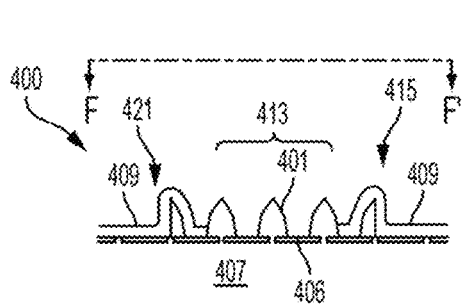

After etching, the second mask layer 414 may be removed to provide the device 400 shown in FIG. 4E. FIG. 5B is a top view of the device 400 after etching and removal of the patterned second mask layer 414. Line F-F' in FIG. 5B corresponds to line F-F' in FIG. 4E, though the device 400 is not necessarily shown to scale. The dielectric layer 409 is removed from the active region 413 of the device 400. The dielectric layer 409 may extend around a periphery of the active region 413 to define the boundary of the active region 413, as shown in FIG. 5B. The dielectric layer 409 may provide a generally planar top surface over the "flattened" portions 415, 421 of the device 400, and may electrically isolate the top surface of the "flattened" portions 415, 421 from the rest of the device. (The circle 422 in FIG. 5B indicates the future location of the n-side contact 429, described below).

Figure 4F:
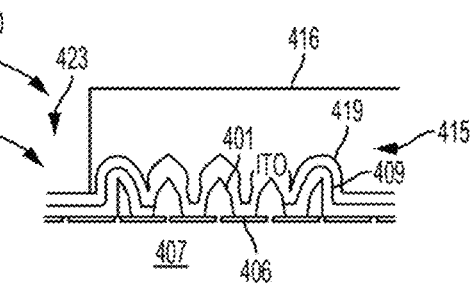

An acid clean may be performed of the device 400 and a transparent conductive film (TCF) layer 419, such as an indium tin oxide (ITO) layer, may be deposited over the device 400, including over the nanowires 401 in the active region 413 and over the dielectric layer 409 in the "flattened" regions 421, 415, as shown in FIG. 4F. The TCF layer 419 may contact the p-type shells of the nanowires 301 to form a p electrode or contact layer. Other TCF materials such as aluminum doped zinc oxide can also be used. The TCF layer 419 may be deposited by physical methods such as evaporation or sputtering, by CVD, or by a combination of methods. In some embodiments, the layer 419 may be deposited by a sputtering method that preferably does not damage the p-type nanowire shells. The ITO layer 419 can be about 100 Å to about 10,000 Å thick, most preferably about 8,000 Å.

Figure 4G:
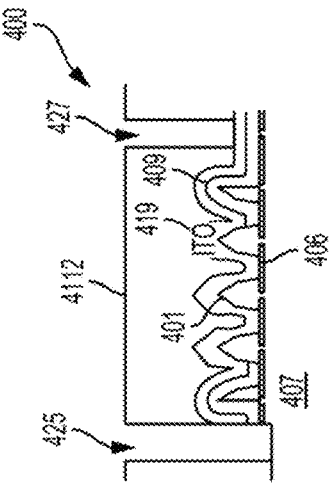

A third mask layer 416, which may be a photoresist layer, is formed over the TCF layer 419 and may be patterned using standard lithographic techniques to define an opening 423 in the third mask layer 416, as shown in FIG. 4F. The opening 423 in the third mask layer 416 defines an n-side contact area 423 within the "flattened" portion 421 of the device 400. The device 400 may then be etched to transfer the pattern of the third mask layer 416 to the device 400. The etching may stop at or in the buffer layer 407 of the device 400 to expose then n-type buffer layer material in the n-side contact area 423 (e.g., form a "mesa" structure). The etch may be a dry etch or a wet etch. In one embodiment, a dry etch is used, such as an inductively coupled plasma (ICP) etch, which may utilize a chlorine gas plasma. Chlorine will etch $SiO_2$, ITO, SiN and GaN. Following the etch, the third mask layer 416 is removed to provide the device 400 as shown in FIG. 4G. FIG. 5C is a top view of the device 400 after etching and removal of the patterned third mask layer 416. Line G-G' in FIG. 5C corresponds to line G-G' in FIG. 4G, though the device 400 is not necessarily shown to scale. As shown in FIG. 5C, for example, the n-side contact area 423 may be located in the "flattened" region in the lower left hand corner of the device 400.

Figure 4I:
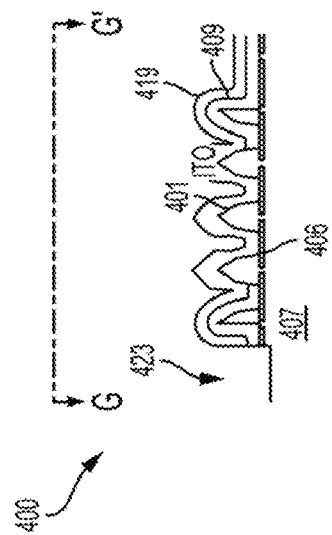
Figure 4H:
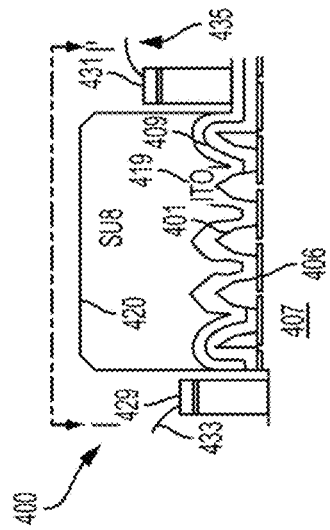

A fourth mask layer 418, which may be a photoresist layer, is formed over the device 400 and may be patterned using standard lithographic techniques to provide a first opening 425 over the n-side contact area 421, and a second opening 427 over the "flattened" area 415, as shown in FIG. 4H. The openings 425, 427 in the fourth mask layer 418 define the locations for the n- and p-metal contacts, respectively. The opening 425 for the n-side metal contact may be smaller than the n-side contact area 423 to isolate the n-side metal contact from the exposed TCF layer 419 and any partially-etched nanowires 401. A metal contact stack, which can include Al, Ti, and Au, may then be deposited by evaporation over the fourth mask layer 418 and within the openings 425, 427. The metal stack may be deposited with a thickness of 1-10 μm (e.g., 2-4 μm, such as about 3.3 μm). The metal contact stack may be deposited in the order of aluminum first and gold last, with gold being the film on the surface, where gold does not require thermal processing to make a good ohmic contact. The fourth mask layer 418 with the deposited metal is then removed (e.g., lifted off the device) to leave n- and p-metal contacts 429, 431 on the device 400 as shown in FIG. 4I. FIG. 5D is a top view of the device 400 after metal deposition and removal (e.g., lift off) of the patterned fourth mask layer 418. Line H-H' in FIG. 5D corresponds to line H-H' in FIG. 4I, though the device 400 is not necessarily shown to scale.

Figure 4J:
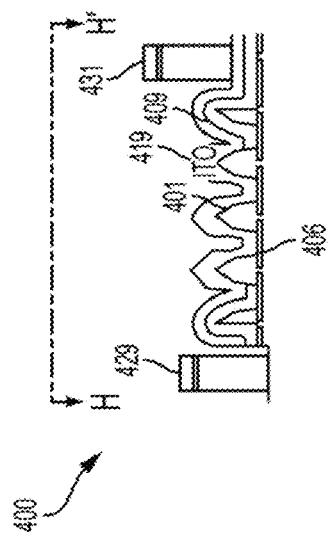

A fifth mask layer 420 may then be formed over the device 400, as shown in FIG. 4J. The fifth mask layer 420 may be $SiO_2$ deposited by CVD or any other suitable method, which may be used to passivate the device 400. The fifth mask layer 420 may have an average thickness of 0.2-5 μm (e.g., 0.02-2 μm, such as about 1.5 μm). The fifth mask layer 420 may be processed and developed using standard $SiO_2$ lithography and etching (wet or dry) techniques to remove the fifth mask layer 420 from an area around the n-metal and p-metal electrodes 429, 431, as shown in FIG. 4J. The fifth mask layer 420 may remain over the active region of the device 400. FIG. 5E is a top view of the device 400 illustrating the fifth mask layer 420 and n-metal and p-metal electrodes 429, 431. Line I-I' in FIG. 5E corresponds to line I-I' in FIG. 4J, though the device 300 is not necessarily shown to scale. Wires 433, 435 may be bonded to the n-metal and p-metal electrodes 429, 431, as shown in FIG. 4J.

Figure 10B:
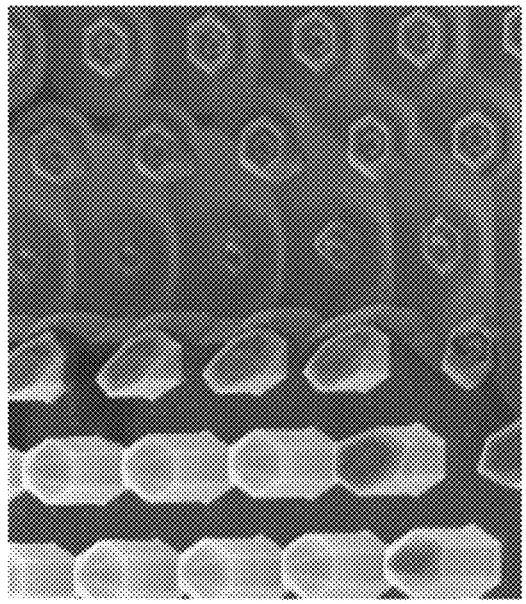
FIGS. 10A-10C are SEM micrographs showing etched and unetched nanowires protected by photoresist made according to an embodiment of the method.
Figure 10A:
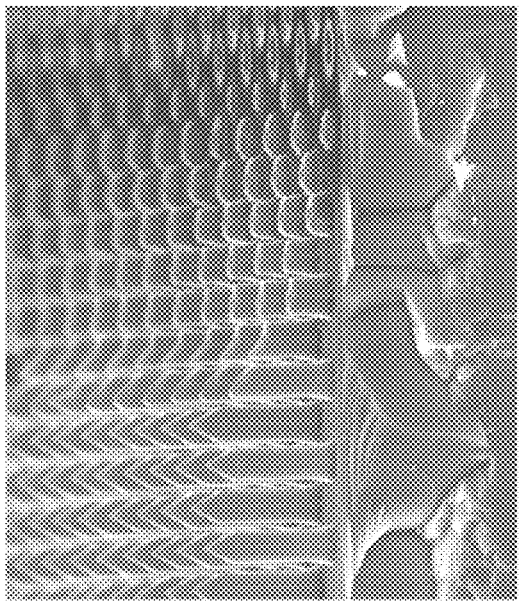
Figure 10C:
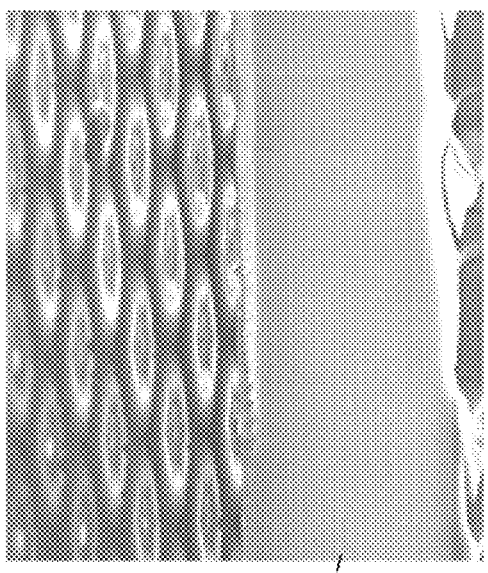

FIGS. 10A-10C are SEM micrographs showing etched and unetched nanowires protected by photoresist made according to an embodiment of the method. FIG. 10A illustrates a cross section through a wafer. The nanowires 401 on the left side of the figure were protected during etching with a photolithographically formed etch mask. FIG. 10B illustrates the same embodiment at a 30° tilt and a higher magnification. As in the FIG. 10A, the nanowires 401 on the left side of the figure were protected while the nanowires 401 on the right have been removed. FIG. 10C is a close up of the right, unprotected side of the wafer. FIG. 10C demonstrates that the nanowires can be removed with little or no etching of the buffer layer 7.

Figure 11:
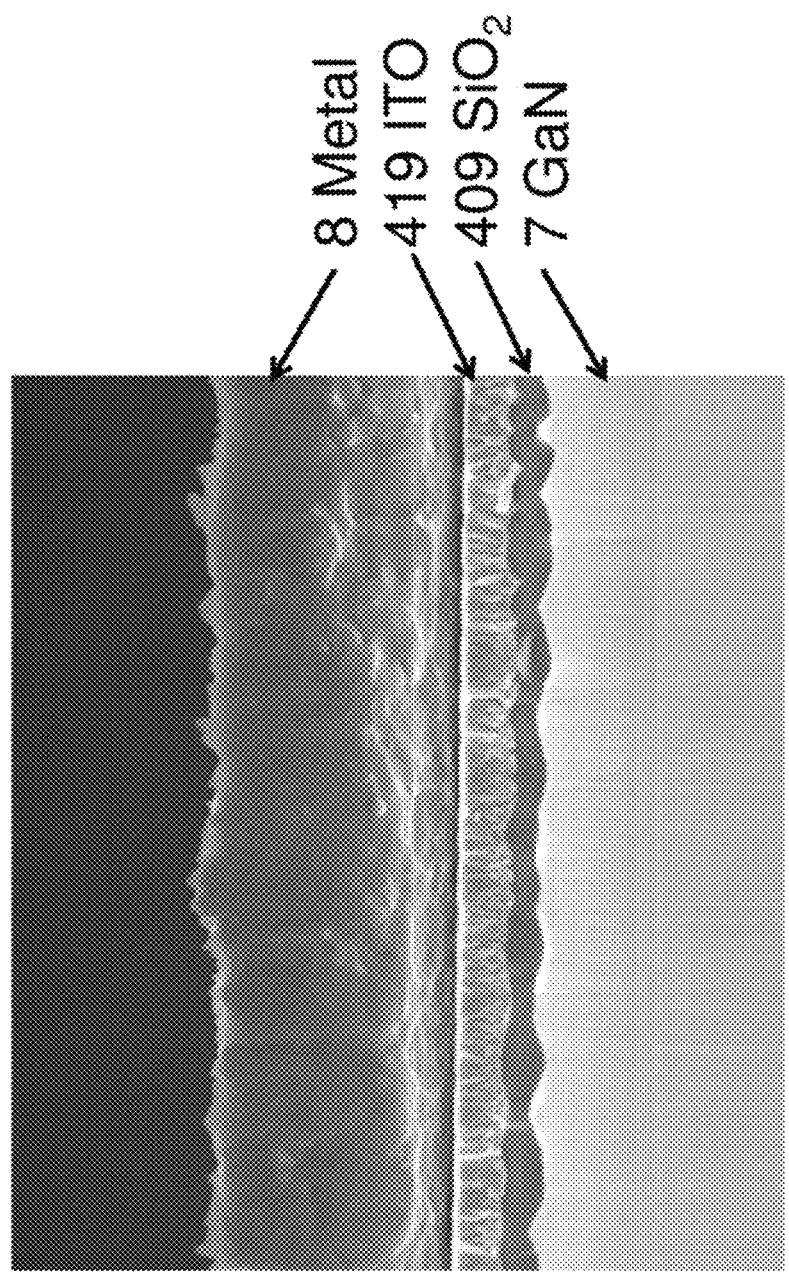
FIG. 11 is an X-ray secondary emission microscopy (XSEM) micrograph of a metal contact on an area where nanowires have been etched.

FIG. 11 is a cross sectional scanning electron microscope (XSEM) micrograph of a metal contact on an area where nanowires have been etched. The XSEM micrograph clearly illustrates the GaN buffer layer 7, the $SiO_2$ layer 409 on the buffer layer 7, the ITO layer 419 covering the nanowires 401 and the metal bond pad 8 over the ITO layer 419.

Figure 12C:
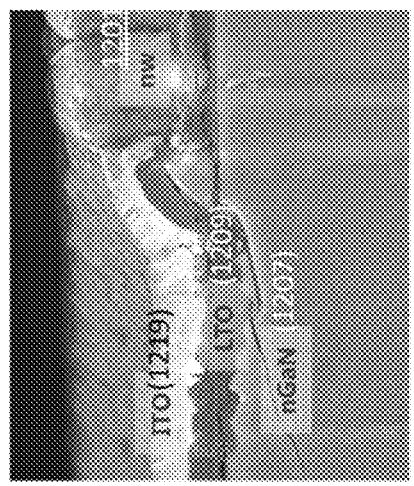
FIGS. 12A-12C are SEM images of a nanowire array with a patterned insulating layer for planarizing and defining an active region according to yet another embodiment.
Figure 12B:
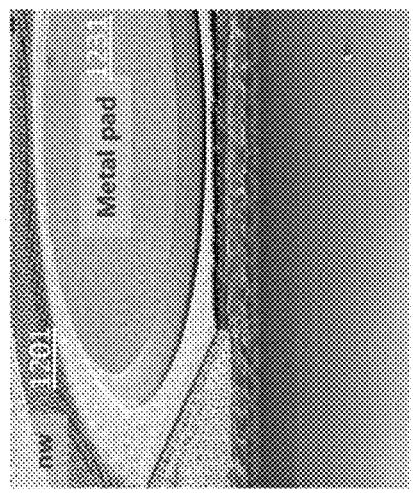
Figure 12A:
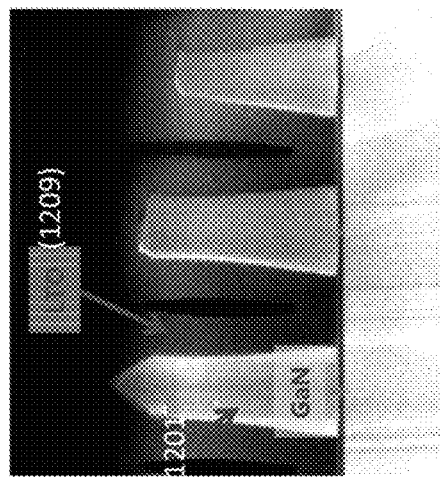

FIGS. 12A-C are scanning electron microscope (SEM) images of a GaN-based nanowire array 1201 having a patterned dielectric layer 1209, which may be a low temperature oxide (LTO), such as $SiO_2$, formed over the array 1201 in accordance with the embodiment described above in connection with FIGS. 4A-5E. FIG. 12A is a cross-sectional SEM image of the array 1201 after deposition of the dielectric layer 1209 (i.e., LTO). FIG. 12B is a tilt SEM image of a p contact area after deposition a metal contact pad 1231 with the photoresist stripped. FIG. 12C is a cross-sectional SEM image of a p contact area outside of the metal contact pad. As shown in FIG. 12C, the p contact area is "flattened" relative to the nanowires 1201, the dielectric layer 1209 (LTO, such as SiO$_2$) insulates the underlying n-GaN layer 1207 from the p-electrode layer 1219 (ITO) above, and the p-electrode layer connects the metal contact 1231 with the p-GaN shells of the nanowires 1201.

Although the present invention is described in terms of nanowire LEDs, it should be appreciated that other nanowire based semiconductor devices, such as field effect transistors, diodes and, in particular, devices involving light absorption or light generation, such as, photodetectors, solar cells, laser, etc., can be implemented on any nanowire structures.

In addition, although several example embodiments are described and illustrated as a top emitting nanowire LED, where light is extracted in the direction from base to the tip of the nanowire, it will be understood that embodiments may also include bottom emitting nanowire LEDs. In general, the construction of a bottom emitting nanostructure entails providing reflective structure, such as a mirror, at or near i.e. adjacent the top portions of each individual light emitting nanoelement so as to direct the emitted light backwards through the buffer layer of the device. Bottom-emitting electrodes are described further in U.S. Patent Publication No. 2011/0309382, filed on Jun. 17, 2011 and PCT Application No. PCT/US11/40932, filed Jun. 17, 2011, both of which are incorporated herein by reference in their entirety.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to ante-date such publication by virtue of prior invention. Further, the dates of publication provided may be different from the actual publication dates which may need to be independently confirmed.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. An etching method comprising:
   providing a support containing a semiconductor buffer layer;
   forming a dielectric masking layer on the semiconductor buffer layer;
   forming openings in the dielectric masking layer to expose the semiconductor buffer layer;
   growing a plurality of semiconductor nanostructures extending away from the support through the openings in the dielectric masking layer and in contact with the semiconductor buffer layer exposed in the openings, such that the plurality of semiconductor nanostructures extend above a top surface of the dielectric masking layer;
   forming a flowable material layer between the semiconductor nanostructures and over a top surface of the dielectric masking layer to cover an entire top surface of the dielectric masking layer;
   forming a patterned mask over a first portion of the flowable material and the first portion of the plurality of semiconductor nanostructures, wherein the patterned mask is vertically spaced from the dielectric masking layer at least by a bottom portion of the flowable material that overlies the dielectric masking layer, such that a second portion of the flowable material and a second portion of the plurality of semiconductor nanostructures are not located under the patterned mask; and
   etching the second portion of the flowable material and the second portion of the plurality of semiconductor nanostructures to remove the second portion of the flowable material and the second portion of the plurality of semiconductor nanostructures to leave the first portion of the flowable material and the first portion of the plurality of semiconductor nanostructures unetched.

2. The method of claim 1, further comprising selectively removing at least a part of the first portion of the flowable material after the step of etching to leave the first portion of the plurality of semiconductor nanostructures over the support.

3. The method of claim 1, wherein forming the patterned mask comprises depositing a photoresist layer over the flowable material layer and pattering the photoresist.

4. The method of claim 1, wherein the step of etching comprises etching the second portion of the flowable material and the second portion of the plurality of semiconductor nanostructures to remove the second portion of the flowable material and the second portion of the plurality of semiconductor nanostructures to leave the patterned mask, the first portion of the flowable material and the first portion of the plurality of semiconductor nanostructures unetched.

5. The method of claim 1, further comprising etching the first portion of the flowable material to reduce a height of the first portion of the flowable material between the first portion of the plurality of semiconductor nanostructures.

6. The method of claim 1, wherein the flowable material comprises a spin on glass or a photoresist.

7. The method of claim 1, wherein:
   the flowable material layer comprises a photoresist material layer; and
   the method comprises exposing a region of an upper portion of the photoresist material layer to radiation while not exposing another region of the upper portion of the photoresist material layer and a lower portion of the photoresist material layer, and removing the exposed region of the upper portion of the photoresist material layer, wherein the unexposed portion of the photoresist material layer constitutes the patterned mask.

8. The method of claim 7, further comprising etching remaining portions of the photoresist material layer by an anisotropic dry etching process to remove regions of the lower portion of the photoresist material layer that are not covered by the patterned mask concurrently with removal of the patterned mask.

9. The method of claim 7, wherein:
regions of the lower portion of the photoresist material layer that are not covered by the patterned mask includes the second portion of the flowable material; and
the method comprises etching the second portion of the flowable material concurrently with removal of the patterned mask.

10. The method of claim 9, wherein the second portion of the flowable material and the patterned mask are removed by an anisotropic dry etching process.

11. The method of claim 1, wherein:
the flowable material layer comprises a spin on glass; and
the patterned mask comprises a photoresist layer that is applied directly on a top surface of the flowable material layer and is subsequently lithographically patterned.

12. The method of claim 11, wherein:
regions of the flowable material layer that are not covered by the patterned mask include the second portion of the flowable material; and
the method comprises etching the second portion of the flowable material employing the patterned mask as an etch mask.

* * * * *